United States Patent
Ayabe et al.

(10) Patent No.: US 11,282,719 B2
(45) Date of Patent: Mar. 22, 2022

(54) SUBSTRATE PROCESSING APPARATUS, SUBSTRATE PROCESSING METHOD AND RECORDING MEDIUM OF PERFORMING LIQUID EXCHANGE PROCESSING ACCORDING TO LIQUID EXCHANGE CONDITION

(71) Applicant: Tokyo Electron Limited, Tokyo (JP)

(72) Inventors: Go Ayabe, Koshi (JP); Kouji Takuma, Koshi (JP); Ryo Manabe, Koshi (JP); Jong Won Yun, Cheongju-si (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 276 days.

(21) Appl. No.: 16/371,286

(22) Filed: Apr. 1, 2019

(65) Prior Publication Data

US 2019/0304811 A1  Oct. 3, 2019

(30) Foreign Application Priority Data

Apr. 2, 2018 (JP) .............................. JP2018-070762

(51) Int. Cl.
*H01L 21/67* (2006.01)
*B08B 3/04* (2006.01)
(Continued)

(52) U.S. Cl.
CPC .......... *H01L 21/67051* (2013.01); *B08B 3/04* (2013.01); *H01L 21/02057* (2013.01); *H01L 21/68764* (2013.01)

(58) Field of Classification Search
CPC ......... H01L 21/67051; H01L 21/02057; H01L 21/68764; B08B 3/04
See application file for complete search history.

(56) References Cited

U.S. PATENT DOCUMENTS

| 5,855,792 A * | 1/1999 | Adams .............. H01L 21/67028 210/696 |
| 6,415,803 B1 * | 7/2002 | Sundin ...................... B08B 3/00 134/108 |

(Continued)

FOREIGN PATENT DOCUMENTS

| JP | H10-177982 A | 6/1998 |
| JP | 2006-269743 A | 10/2006 |
| JP | 2007-273791 A | 10/2007 |

*Primary Examiner* — Joseph L. Perrin
*Assistant Examiner* — Irina Graf
(74) *Attorney, Agent, or Firm* — Pearne & Gordon LLP

(57) ABSTRACT

A substrate processing apparatus 10 includes processing units 16 each configured to process a wafer W; tanks 102 and 202 each configured to store a processing liquid; processing liquid supply units 103 and 203 each configured to supply the processing liquid into the processing unit 16; drain units 110 and 210 each configured to drain the processing liquid; supplement units 112 and 212 each configured to supplement the tanks 102 and 202 with the processing liquids; and a control unit 18. The control unit 18 is configured to perform a process job by controlling the processing liquid supply units 103 and 203 and the processing unit 16 and perform, when predetermined liquid exchange conditions are met during the performing of the process job, a liquid exchange processing in parallel with the process job by controlling the drain units 110 and 210 and the supplement units 112 and 212.

10 Claims, 7 Drawing Sheets

(51) Int. Cl.
*H01L 21/02* (2006.01)
*H01L 21/687* (2006.01)

(56) References Cited

U.S. PATENT DOCUMENTS

| | | | |
|---|---|---|---|
| 6,508,695 B2* | 1/2003 | Tanikawa | B24B 37/04 210/194 |
| 6,851,436 B1* | 2/2005 | Ravkin | B08B 3/00 134/109 |
| 7,743,783 B2* | 6/2010 | Edwards | C23F 1/00 137/2 |
| 8,257,781 B1* | 9/2012 | Webb | C23C 18/1676 427/97.9 |
| 2003/0130754 A1* | 7/2003 | Tanaka | H01L 21/67745 700/99 |
| 2013/0220478 A1* | 8/2013 | Kasahara | H01L 21/67017 141/2 |
| 2013/0260569 A1* | 10/2013 | Ganster | H01L 21/67017 438/745 |
| 2016/0225683 A1* | 8/2016 | Sato | H01L 21/30604 |

\* cited by examiner

SUBSTRATE PROCESSING APPARATUS, SUBSTRATE PROCESSING METHOD AND RECORDING MEDIUM OF PERFORMING LIQUID EXCHANGE PROCESSING ACCORDING TO LIQUID EXCHANGE CONDITION

CROSS-REFERENCE TO RELATED APPLICATION

This application claims the benefit of Japanese Patent Application No. 2018-070762 filed on Apr. 2, 2018, the entire disclosures of which are incorporated herein by reference.

TECHNICAL FIELD

The embodiments described herein pertain generally to a substrate processing apparatus, a substrate processing method, and a recording medium.

BACKGROUND

Patent Document 1 describes an apparatus configured to supply a processing liquid to a substrate being rotated and perform cleaning or etching on the substrate. In this apparatus, the processing liquid stored in a tank is supplied to the substrate by using a liquid feeding mechanism such as a pump or the like.

Patent Document 1: Japanese Patent Laid-open Publication No. 2006-269743

SUMMARY

In view of the foregoing, the processing liquid stored in the tank is regularly exchanged with a new processing liquid (liquid exchange is performed). Here, for example, if a process job is performed even at a liquid exchange timing, a liquid exchange is not performed until the process job is completed. That is, typically, the liquid exchange is performed after the process job is completed. While the liquid exchange is being performed, it is difficult to perform the process job. As a result, the liquid exchange is performed after the process job is completed, so that a downtime of the apparatus (a time period during which the apparatus cannot perform the process job) is increased.

Accordingly, exemplary embodiments of the present disclosure are provided to reduce the downtime of the apparatus.

A substrate processing apparatus includes a substrate processing unit configured to process a substrate with a processing liquid; a reservoir configured to store therein the processing liquid; a processing liquid supply unit configured to supply the processing liquid in the reservoir to the substrate processing unit; a drain unit configured to drain the processing liquid in the reservoir; a supplement unit configured to supplement the reservoir with the processing liquid; and a control unit. The control unit is configured to perform a process job by controlling the processing liquid supply unit to supply the processing liquid to the substrate processing unit and controlling the substrate processing unit to process the substrate with the processing liquid. The control unit is further configured to perform, when predetermined liquid exchange conditions are met during the performing of the process job, a liquid exchange processing in parallel with the process job by controlling the drain unit to drain the processing liquid in the reservoir and controlling the supplement unit to supplement the reservoir with a new processing liquid.

A substrate processing method includes performing a process job of processing a substrate with a processing liquid; and performing a liquid exchange processing, in which the processing liquid stored in a reservoir configured to store therein the corresponding processing liquid is drained and the reservoir is supplemented with a new processing liquid, in parallel with the process job when predetermined liquid exchange conditions are met in the process job.

According to the exemplary embodiments, it is possible to reduce the downtime of the apparatus.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
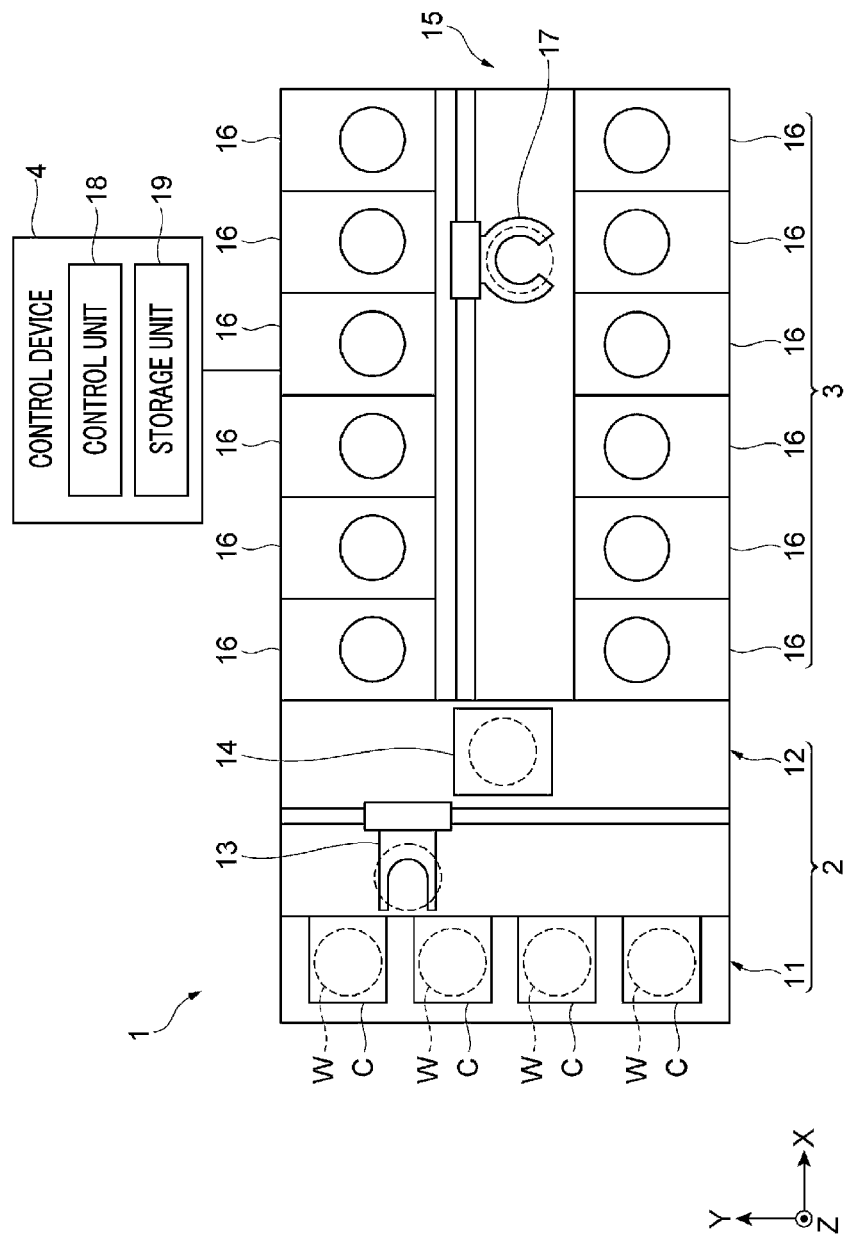
FIG. 1 is a plan view schematically illustrating a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

The following exemplary embodiments are examples for describing the present disclosure, and the present disclosure is not limited thereto. In the following description, same parts or parts having same function will be assigned same reference numerals, and redundant description will be omitted.

[Configuration of Substrate Processing System]

FIG. 1 is a diagram illustrating a schematic configuration of a substrate processing system according to the present exemplary embodiment. In the following, in order to clarify positional relationships, the X-axis, Y-axis and Z-axis which are orthogonal to each other will be defined, and the positive Z-axis direction will be regarded as a vertically upward direction.

As depicted in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates, i.e., semiconductor wafers in the present exemplary embodiment (hereinafter, referred to as "wafers W"), horizontally.

The transfer section 12 is provided adjacent to the carrier placing section 11, and provided with a substrate transfer device 13 and a delivery unit 14 therein. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis, and transfers the wafers W between the delivery unit 14 and the processing units 16 by using the wafer holding mechanism.

The processing units 16 perform a predetermined substrate processing on the wafers W transferred by the substrate transfer device 17 under the control of a control unit 18 of a control device 4 which will be described later.

Further, the substrate processing system 1 is provided with the control device 4. The control device 4 is, for example, a computer, and includes the control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. The processed wafer W placed on the delivery unit 14 is returned to the carrier C of the carrier placing section 11 by the substrate transfer device 13.

[Configuration of Substrate Processing Apparatus]

Figure 2:
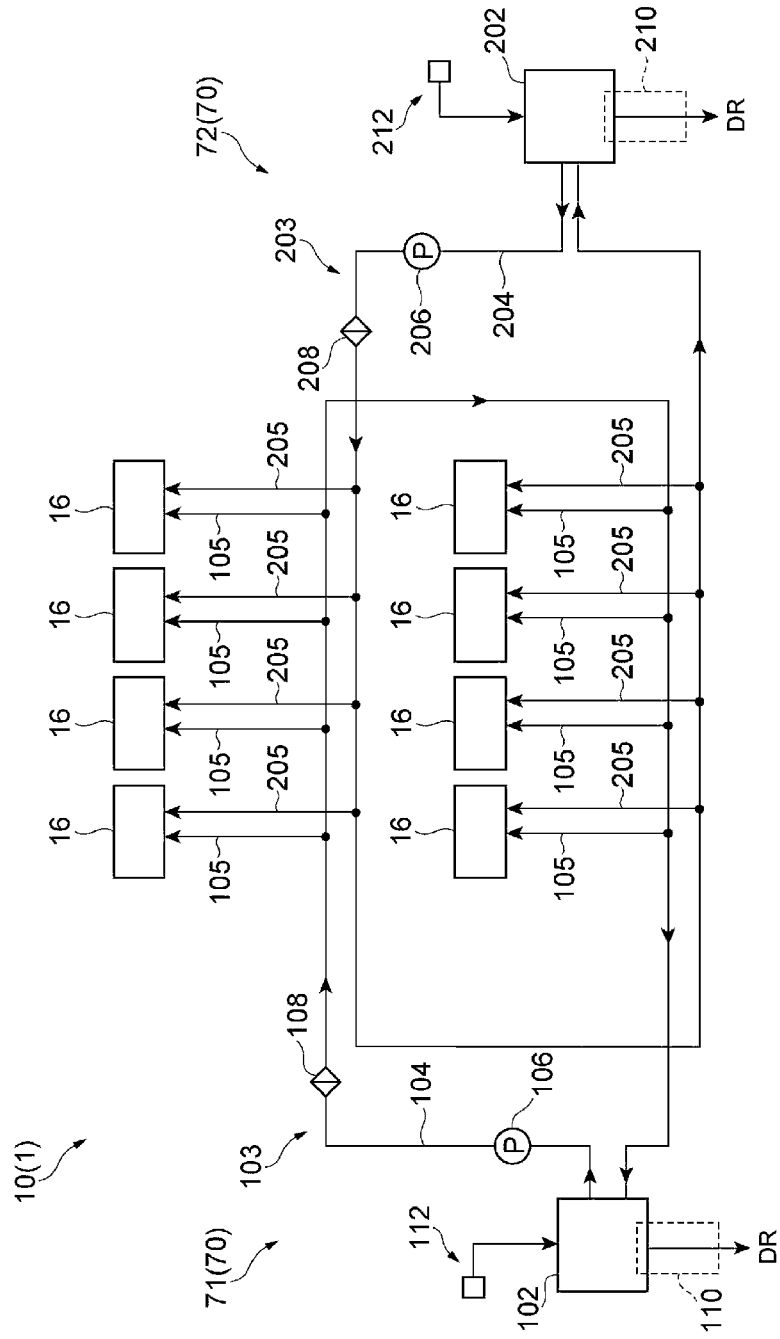
FIG. 2 is a diagram illustrating a schematic configuration of a substrate processing apparatus included in the substrate processing system.

Now, a configuration of a substrate processing apparatus 10 included in the substrate processing system 1 will be explained with reference to FIG. 2 to FIG. 5. As depicted in FIG. 2, the substrate processing apparatus 10 is provided with the processing units (substrate processing units) 16 each configured to process a wafer W with a processing liquid (i.e., perform a liquid processing), a supply device 70 configured to supply the processing liquid to the processing units 16, and the control device 4 configured to control them (see FIG. 1 and FIG. 4, as will be described in detail later).

(Supply Mechanism)

The supply device 70 is provided with a first supply device 71 and a second supply device 72. The first supply device 71 is provided with a tank 102 (first reservoir) configured to store therein a first processing liquid, a processing liquid supply unit 103, a drain unit 110, and a supplement unit 112. The first processing liquid is a processing liquid used for performing a liquid processing on the wafer W, and may be, for example, diluted hydrofluoric acid (DHF). The processing liquid supply unit 103 is configured to supply the first processing liquid in the tank 102 to the processing units 16 under the control of the control unit 18 of the control device 4. The processing liquid supply unit 103 is provided with a circulation line 104 starting from the tank 102 and returning back to the tank 102, branch lines 105 extended from the circulation line 104 toward the respective processing units 16, and a pump 106 and a filter 108 provided on the circulation line 104. The branch lines 105 supply the first processing liquid flowing in the circulation line 104 into the corresponding processing units 16, respectively. Each branch line 105 may be provided with a flow rate control device such as a flow rate control valve, a filter, and the like, if necessary. The pump 106 generates a circulation flow that starts from the tank 102 and returns back to the tank 102 through the circulation line 104. The filter 108 is provided at a downstream side of the pump 106 to remove contaminants such as particles contained in the processing liquid. Auxiliary devices (e.g., heater or the like) may be further provided on the circulation line 104, if necessary.

The drain unit 110 and the supplement unit 112 are components to perform a liquid exchange of the first processing liquid in the tank 102. The drain unit 110 is configured to drain (waste) the first processing liquid in the tank 102 under the control of the control unit 18. The drain unit 110 includes, for example, a valve (not illustrated) configured to control ON/OFF of a flow of the first processing liquid into a drain line connected to the tank 102. The supplement unit 112 is configured to supplement the tank 102 with a new first processing liquid under the control of the control unit 18. The supplement unit 112 includes, for example, a supplementary processing liquid tank (not illustrated), a pump (not illustrated) configured to force-feed the first processing liquid from the supplementary processing liquid tank, and a valve (not illustrated) configured to control ON/OFF of a flow of the first processing liquid into a supply line connected to the tank 102.

The second supply device 72 is provided with a tank 202 (second reservoir) configured to store therein a second processing liquid, a processing liquid supply unit 203, a drain unit 210, and a supplement unit 212. The second processing liquid is a processing liquid used for performing a liquid processing on the wafer W, and may be, for example, Standard Clean 1 (SC1). The processing liquid supply unit 203 is configured to supply the second processing liquid in the tank 202 to the processing units 16 under the control of the control unit 18. The processing liquid supply unit 203 is provided with a circulation line 204 starting from the tank 202 and returning back to the tank 202, branch lines 205 extended from the circulation line 204 toward the respective processing units 16, and a pump 206 and a filter 208 provided on the circulation line 204. The branch lines 205 supply the second processing liquid flowing in the circulation line 204 into the corresponding processing units 16, respectively. Each branch line 205 may be provided with a flow rate control device such as a flow rate control valve, a filter, and the like, if necessary. The pump 206 generates a circulation flow that starts from the tank 202 and returns back to the tank 202 through the circulation line 204. The filter 208 is provided at a downstream side of the pump 206 to remove contaminants such as particles contained in the processing liquid. Auxiliary devices (e.g., heater or the like) may be further provided on the circulation line 204, if necessary.

The drain unit 210 and the supplement unit 212 are components to perform a liquid exchange of the second processing liquid in the tank 202. The drain unit 210 is configured to drain the second processing liquid in the tank 202 under the control of the control unit 18. The drain unit 210 includes, for example, a valve (not illustrated) configured to control ON/OFF of a flow of the second processing liquid into a drain line connected to the tank 202. The supplement unit 212 is configured to supplement the tank 202 with a new second processing liquid under the control of the control unit 18. The supplement unit 212 includes, for example, a supplementary processing liquid tank (not illustrated), a pump (not illustrated) configured to force-feed the second processing liquid from the supplementary processing liquid tank, and a valve (not illustrated) configured to control ON/OFF of a flow of the second processing liquid into a supply line connected to the tank 202.

Further, though it has been described that DHF is used as the first processing liquid and SC1 is used as the second processing liquid, the exemplary embodiment is not limited thereto, and SC2, SPM, BHF or TMAH may be used as the processing liquids.

(Processing Unit)

Figure 3:
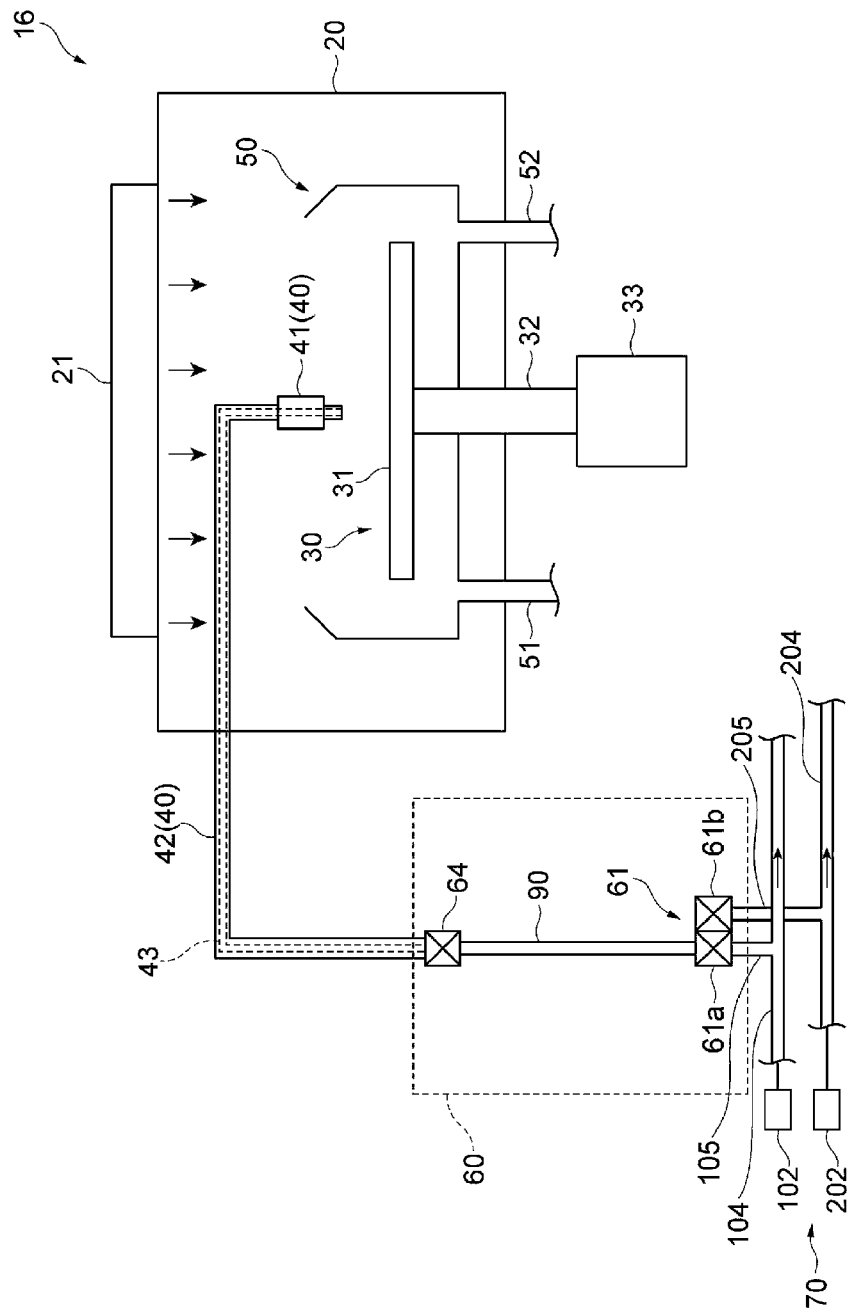
FIG. 3 is a diagram illustrating a schematic configuration of a processing unit.

As depicted in FIG. 3, the processing unit 16 is provided with a chamber 20, a substrate holding mechanism 30, a processing liquid discharging unit 40, a recovery cup 50, and a supply path opening/closing device 60.

The chamber 20 accommodates the substrate holding mechanism 30, the processing liquid discharging unit 40, and the recovery cup 50. A fan filter unit (FFU) 21 is provided at the ceiling of the chamber 20. The FFU 21 forms a downflow within the chamber 20.

The substrate holding mechanism 30 is provided with the holding unit 31, a supporting unit 32, and a driving unit 33. The holding unit 31 horizontally holds a wafer W. The supporting unit 32 is a member which is extended in a vertical direction. Further, a base end portion of the supporting unit 32 is pivotably supported by the driving unit 33 and a tip end portion of the supporting unit 32 horizontally supports the holding unit 31. The driving unit 33 is configured to rotate the supporting unit 32 around a vertical axis under the control of the control unit 18. The substrate holding mechanism 30 rotates the supporting unit 32 through the driving unit 33 to rotate the holding unit 31 supported by the supporting unit 32, so that the wafer W held by the holding unit 31 is rotated.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

The processing liquid discharging unit 40 supplies the processing liquid supplied from the supply device 70 onto the wafer W. The processing liquid discharging unit 40 is connected to the supply device 70 via the supply path opening/closing device 60. The processing liquid discharging unit 40 is provided with a nozzle 41 configured to discharge the processing liquid to the wafer W, an arm 42 configured to support the nozzle 41, and a supply line 43 extended within each of the nozzle 41 and the arm 42. For example, the arm 42 is provided to be pivotable around a vertical axis and movable vertically along the vertical axis under the control of the control unit 18. The supply line 43 is connected to a second valve 64 of the supply path opening/closing device 60 (which will be described later) and extended to a discharge opening of the nozzle 41.

The supply path opening/closing device 60 is a device provided on a supply line 90 provided between the branch lines 105 and 205 branched from the respective circulation lines 104 and 204 and the supply line 43 of the processing liquid discharging unit 40, and configured to switch the processing liquid flowing in the supply line 90 under the control of the control unit 18. Since the processing liquid flowing in the supply line 90 is switched by the supply path opening/closing device 60, any one of the first processing liquid or the second processing liquid is supplied into the processing liquid discharging unit 40.

If a side where the branch lines 105 and 205 are provided is defined as an upstream side of the supply line 90 and a side where the supply line 43 is provided is defined as a downstream side, the supply path opening/closing device 60 is provided with a first valve 61 and a second valve 64 in sequence from the upstream side. The first valve 61 includes a first system valve 61a and a second system valve 61b. The first system valve 61a is connected to the branch line 105 branched from the circulation line 104 for the first processing liquid. The second system valve 61b is connected to the branch line 205 branched from the circulation line 204 for the second processing liquid. In the supply path opening/closing device 60, any one of the first system valve 61a or the second system valve 61b is connected to the supply line 90 under the control of the control unit 18. The second valve 64 is connected to the supply line 43 of the processing liquid discharging unit 40. The second valve 64 is opened or closed under the control of the control unit 18 to open or close the supply line 90 with respect to the supply line 43.

(Control Unit)

Figure 4:
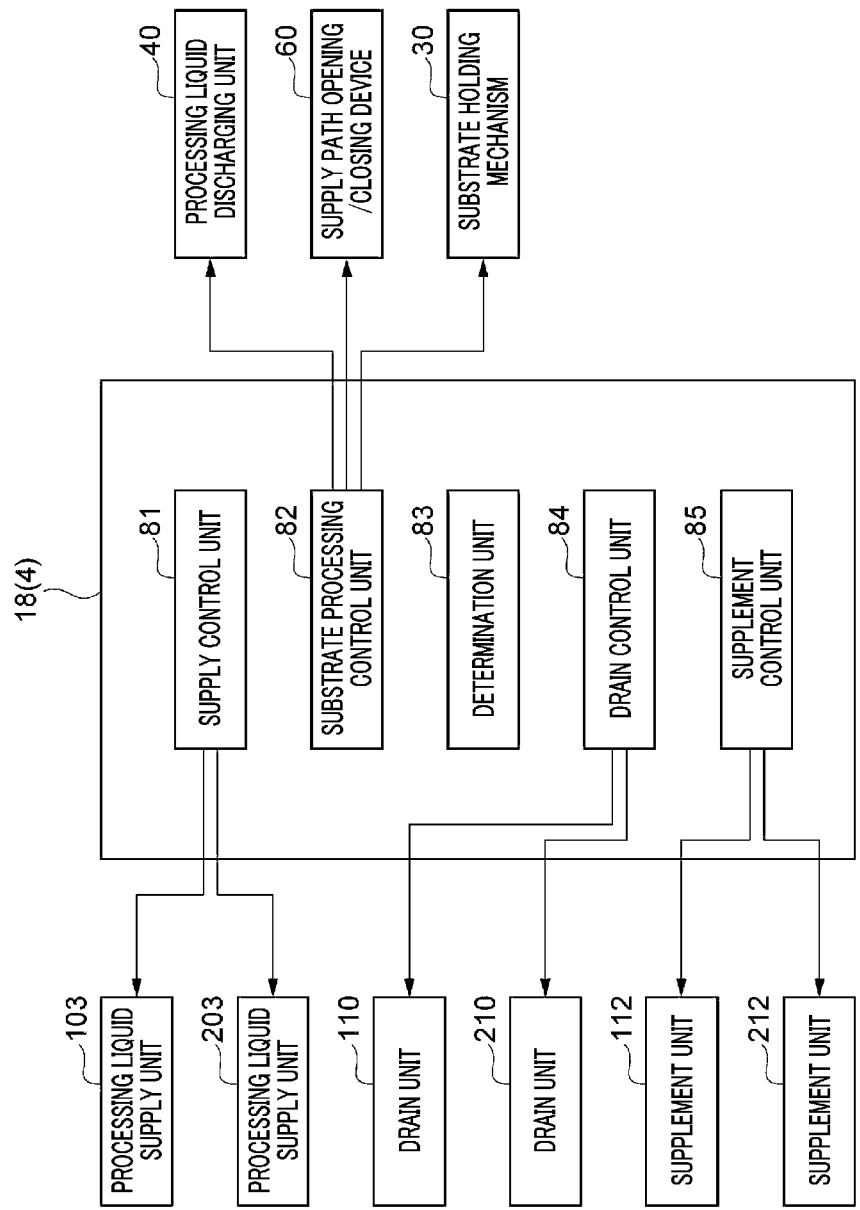
FIG. 4 is a diagram illustrating functional blocks of a control unit.

As depicted in FIG. 4, the control unit 18 includes a supply control unit 81, a substrate processing control unit 82, a determination unit 83, a drain control unit 84, and a supplement control unit 85 as functional modules.

The supply control unit 81 controls the processing liquid supply unit 103 to supply the first processing liquid into the processing units 16, and controls the processing liquid supply unit 203 to supply the second processing liquid into the processing units 16. To be specific, the supply control unit 81 controls the pump 106 to flow the first processing liquid in the tank 102 through the circulation line 104 into the branch lines 105 corresponding to the respective processing units 16. Further, the supply control unit 81 controls the pump 206 to flow the second processing liquid in the tank 202 through the circulation line 204 to the branch lines 205 corresponding to the respective processing units 16.

The substrate processing control unit 82 performs a process job by controlling the processing unit 16 to process the wafer W with the first processing liquid and controlling the processing unit 16 to process the wafer W with the second processing liquid. Here, the process job is a processing to be performed on one or more wafers W on which a common processing is to be performed. The substrate processing control unit 82 selects one processing liquid used for performing the substrate processing to the wafer W (i.e., processing liquid to be supplied into the processing liquid discharging unit 40) based on recipe information (not illustrated) for the substrate processing. The substrate processing control unit 82 controls the supply path opening/closing device 60 to supply the selected processing liquid into the processing liquid discharging unit 40. When the first processing liquid is selected, the substrate processing control unit 82 opens the first system valve 61a of the supply path opening/closing device 60 to allow the first processing liquid to be flown in the supply line 90 connected to the processing liquid discharging unit 40. When the second processing liquid is selected, the substrate processing control unit 82 opens the second system valve 61b of the supply path opening/closing device 60 to allow the second processing liquid to be flown in the supply line 90 connected to the processing liquid discharging unit 40. Further, the substrate processing control unit 82 opens the second valve 64 of the supply path opening/closing device 60 to allow the processing liquid flowing in the supply line 90 to be flown in the supply line 43 of the processing liquid discharging unit 40. Thus, the processing liquid flows from the supply line 90 to the supply line 43, and then, is discharged from the nozzle 41 toward the wafer W.

The substrate processing control unit 82 controls the driving unit 33 to rotate the supporting unit 32 holding the holding unit 31 while the wafer W is being held by the holding unit 31 (i.e., while the processing liquid is being discharged from the nozzle 41 onto the wafer W). Further, the substrate processing control unit 82 controls a driving mechanism (not illustrated) of the arm 42 such that the arm 42 is rotated, for example, around a vertical axis and movable up and down along the vertical axis.

While the process job is being performed, the determination unit 83 determines whether or not predetermined liquid exchange conditions are met. Herein, the liquid exchange refers to a liquid exchange of the first processing liquid stored in the tank 102 (or the second processing liquid stored in the tank 202). The determination unit 83 determines that the above-described liquid exchange conditions are met for a processing liquid that satisfies a first condition according to a degradation state of the processing liquid stored in the tank 102 (or tank 202) and a second condition according to a performance status of the process job. The first condition according to the degradation state of the processing liquid is a condition on the degradation degree of the processing liquid stored in the tank 102 (or tank 202), and includes, for example, an elapsed time after a previous liquid exchange is performed, whether a predetermined time has elapsed, or whether the number of sheets to be processed in the processing unit 16 has passed. Satisfying the first condition means that the processing liquid is in a state to be exchanged (i.e., the processing liquid is degraded).

The second condition according to the performance status of the process job is a condition on whether the processing liquid is in a state enabled to be exchanged in consideration of the performance status of the process job. The determination unit 83 determines that, for example, the processing liquid whose use in the process job has been ended (i.e., the processing liquid which can be exchanged since it is not used any more in the process job) satisfies the second condition.

Figure 5:
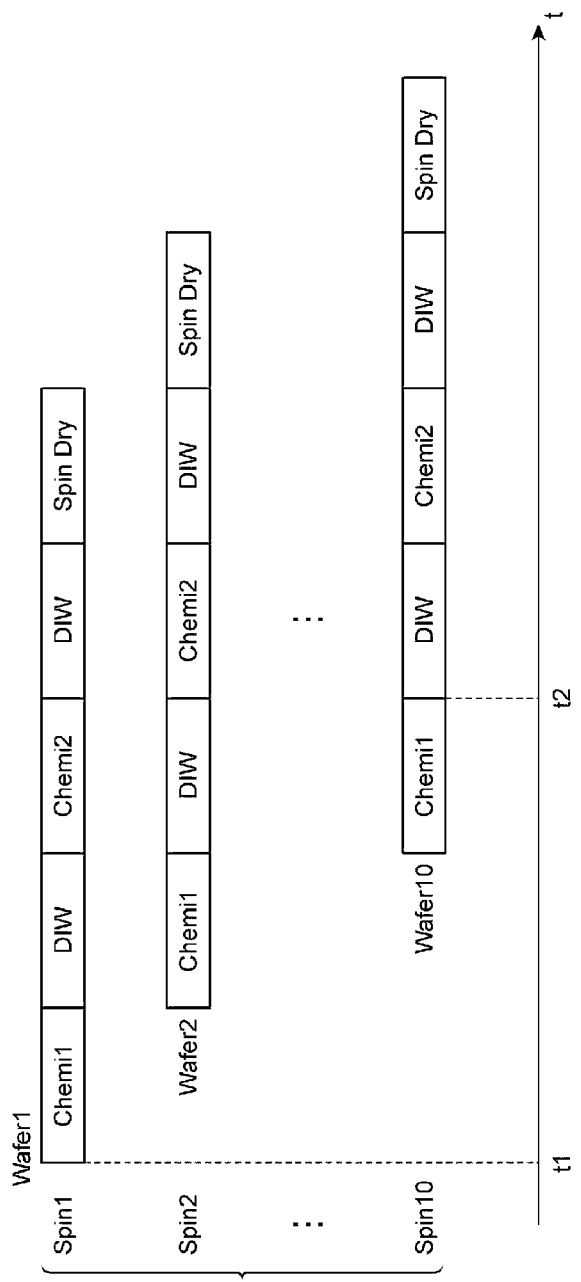
FIG. 5 is a diagram illustrating an example of a time chart of a process job.

FIG. 5 illustrates an example of a time chart of a process job. In FIG. 5, Spin 1 to Spin 10 represent ten (10) processing units 16, Wafer 1 to Wafer 10 represent ten (10) wafers W, Chemi 1 represents a substrate processing using the first processing liquid, Chemi 2 represents a substrate processing using the second processing liquid, DIW represents a rinse processing, and Spin Dry represents a spin-dry processing. Further, the spin-dry processing may be performed after DIW on the wafer W is replaced with IPA. FIG. 5 shows a time chart of a process job which is performed to ten (10) sheets of wafers W (Wafer 1 to Wafer 10). A substrate processing is performed on Wafer 1 to Wafer 10 in Spin 1 to Spin 10, respectively. The same processing is performed in each of the processing units 16, and the substrate processing using the first processing liquid, the rinse processing, the substrate processing using the second processing liquid, the rinse processing, and the spin-dry processing are performed in sequence. In the example shown in FIG. 5, the substrate processing using the first processing liquid starts on Wafer 1 at a time t1. Then, the substrate processing using the first processing liquid is performed on Wafer 2 to Wafer 10 in sequence. Then, the substrate processing using the first processing liquid on Wafer 10 is ended at a time t2. In the process job shown in FIG. 5, Wafer 10 is the last wafer W on which the substrate processing using the first processing liquid is performed. For this reason, the determination unit 83 refers to, e.g., the recipe information (not illustrated) and determines that the first processing liquid is a processing liquid whose use in the process job has been ended since the time t2 so that the first processing liquid satisfies the second condition.

Further, as described above, when the process job is performed on the wafers W as a processing unit, while performing a processing on a substrate in the multiple substrates, which is lastly processed with the processing liquid, during the performing of the process job, if there is a trouble that the corresponding processing cannot be performed appropriately, the determination unit 83 may determine that the corresponding processing liquid satisfies the second condition. That is, according to the example shown in FIG. 5, for example, if there is a trouble when the substrate processing using the first processing liquid is performed on Wafer 10 (the last wafer W to be processed), the determination unit 83 may determine that the first processing liquid satisfies the second condition even when the substrate processing using the first processing liquid on Wafer 10 is not completed. Further, the trouble includes all troubles that can hinder the processing on the wafers W in the process job, and may include, for example, a case where the processing liquid is not discharged properly from the nozzle 41 due to the line blockage or a case where a part of the device constituting the module is not moved properly. If such trouble occurs, an alarm is generated and the rinse processing on the wafer W is performed.

When the determination unit 83 determines that the liquid exchange conditions are met, the drain control unit 84 controls the drain unit 110 (or drain unit 210) to drain the first processing liquid (or second processing liquid) in the tank 102 (or tank 202). That is, when the liquid exchange conditions for the first processing liquid are met, the drain control unit 84 controls a valve (not illustrated) of the drain unit 110 to drain the first processing liquid in the tank 102 through the drain line. Further, when the liquid exchange conditions for the second processing liquid are met, the drain control unit 84 controls a valve (not illustrated) of the drain unit 210 to drain the second processing liquid in the tank 202 through the drain line.

After the processing liquid is drained by the drain control unit 84, the supplement control unit 85 controls the supplement unit 112 (or supplement unit 212) to supplement the tank 102 (or tank 202) with a new first processing liquid (or new second processing liquid). That is, the supplement control unit 85 controls the pump and the valve (not illustrated) of the supplement unit 112 to supplement the tank 102 with a new first processing liquid. Further, the supplement control unit 85 controls the pump and the valve (not illustrated) of the supplement unit 212 to supplement the tank 202 with a new second processing liquid. As described above, when the predetermined liquid exchange conditions are met, the control unit 18 performs a liquid exchange processing in parallel with the process job.

[Liquid Exchange Processing Method]

Figure 6:
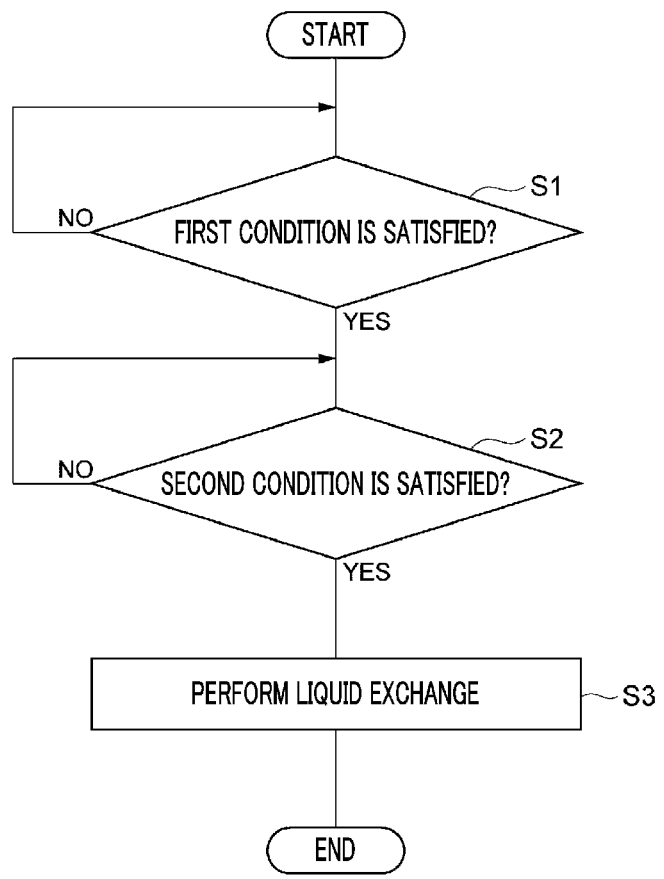
FIG. 6 is a flowchart for describing a sequence of a liquid exchange processing.

Now, an example of a liquid exchange processing which is performed in parallel with the process job will be explained in detail with reference to FIG. 6. The processings shown in FIG. 6 are premised on that the process job is performed in each of the processing units 16. When multiple kinds of processing liquids are used, the processings shown in FIG. 6 are performed independently for each of the multiple kinds of processing liquids. Here, the liquid exchange processing of the first processing liquid will be explained.

First, the control unit 18 determines whether or not the first processing liquid as a determination target satisfies a first condition (process S1). The first condition includes, for example, an elapsed time after a previous liquid exchange is performed, whether a predetermined time has elapsed, or whether the number of sheets to be processed in the processing unit 16 has passed. If it is determined that the first condition is not satisfied in the process S1, the processing (determination) of the process S1 is performed again after the elapse of a predetermined time.

Meanwhile, if it is determined that the first condition is satisfied in the process S1, the control unit 18 determines whether or not the first processing liquid satisfies a second condition (process S2). The second condition is a condition on whether the use of the processing liquid in the process job has been ended. Further, when the process job is performed on the wafers W as a processing unit, while performing a processing on a substrate in the multiple substrates, which is lastly processed with the first processing liquid, during the performing of the process job, if there is a trouble that the corresponding processing cannot be performed appropriately, the control unit 18 may determine that the first processing liquid satisfies the second condition. If it is determined that the second condition is not satisfied in the process S2, the processing (determination) of the process S2 is performed again after the elapse of a predetermined time.

Meanwhile, if it is determined that the second condition is satisfied in the process S2, the control unit 18 determines that the predetermined liquid exchange conditions are met, and then, performs the liquid exchange processing of the first processing liquid. To be specific, the control unit 18 controls the drain unit 110 to drain the first processing liquid in the tank 102 through the drain line, and then, controls the supplement unit 112 to supplement the tank 102 with the first processing liquid.

[Operation]

As described above, the substrate processing apparatus 10 according to the present exemplary embodiment is provided with the processing units 16 configured to process the wafers W with processing liquids, the tanks 102 and 202 configured to store therein the processing liquids, the processing liquid supply units 103 and 203 configured to supply the processing liquids in the tanks 102 and 202 to the processing units 16, the drain units 110 and 210 configured to drain the processing liquids in the tanks 102 and 202, the supplement units 112 and 212 configured to supplement the tanks 102 and 202 with the processing liquids, and the control unit 18. The control unit 18 is configured to perform a process job by controlling the processing liquid supply units 103 and 203 to supply the processing liquids to the processing units 16 and controlling the processing units 16 to process the wafers W with the processing liquids and configured to perform, when predetermined liquid exchange conditions are met during the performing of the process job, the liquid exchange processing in parallel with the process job by controlling the drain units 110 and 210 to drain the processing liquids in the tanks 102 and 202 and controlling the supplement units 112 and 212 to supplement the tanks 102 and 202 with new processing liquids.

In general, when the liquid exchange is needed, the liquid exchange processing is performed after the process job is ended. While the liquid exchange processing is performed, the process job cannot be performed. Therefore, the downtime of the apparatus (a time period during which the apparatus cannot perform the process job) is increased due to the effect of the liquid exchange processing. In this regard, in the substrate processing apparatus 10 according to the present exemplary embodiment, when the predetermined liquid exchange conditions are met, the liquid exchange processing is performed in parallel with the process job. Thus, the downtime of the apparatus can be reduced as compared to the case of performing the liquid exchange processing after the process job is ended.

Further, in the substrate processing apparatus 10, the control unit 18 determines that the above-described liquid exchange conditions are met for the processing liquids that satisfy the first condition according to the degradation state of the processing liquids stored in the tanks 102 and 202 and the second condition according to the performance status of the process job. The processing liquids need to be exchanged when they are degraded, for example, after an elapse of a predetermined time since they are stored. For this reason, satisfying the condition (first condition) according to a degradation state of the processing liquid becomes the liquid exchange condition, and, thus, the liquid exchange processing can be performed at a proper timing of exchanging the liquids. Further, satisfying the condition (second condition) on the performance status of the process job becomes the liquid exchange condition, and, thus, the liquid exchange processing can be performed in consideration of the status of the process job without affecting the process job (i.e., substrate processing with the processing liquids). That is, the first condition and the second condition described above become the liquid exchange conditions, and, thus, it is possible to reduce the downtime of the apparatus while performing the process job properly.

Furthermore, in the substrate processing apparatus 10, the control unit 18 determines that the processing liquid whose use in the process job has been ended satisfies the second condition. Thus, with respect to the processing liquid which is not used any more in the process job thereafter and does not affect the process job even if the liquid exchange processing is performed, the liquid exchange processing can be performed at a proper timing.

Moreover, in the substrate processing apparatus 10, when the process job is performed on the wafers W as the processing unit, while performing a processing on a substrate in the multiple substrates, which is lastly processed with the processing liquid, during the performing of the process job, if there is a trouble that the corresponding processing cannot be performed appropriately, the control unit 18 determines that the corresponding processing liquid satisfies the second condition. Typically, if there is a trouble during the performing of the process job, the liquid exchange processing is performed after the trouble is solved (i.e., after the process job is stopped and recovered). In this regard, in the substrate processing apparatus 10 according to the present exemplary embodiment, it is determined that the second condition is satisfied if there is a trouble while the last wafer W to be processed with the processing liquid is processed, and under the condition that the first condition is satisfied, the liquid exchange processing is performed even while the process job is being performed. The processing liquid being used for processing the last wafer W is required to be exchanged when the first condition is satisfied regardless of the occurrence of trouble. For this reason, if there is a trouble while the last wafer W is processed, it is determined that the second condition is satisfied. Therefore, the liquid exchange processing is performed without waiting for the recovery (to be specific, the liquid exchange processing is performed under the condition that the first condition is satisfied), and, thus, the downtime can be reduced.

[Another Exemplary Embodiment]

So far, the exemplary embodiment has been described. However, various changes and modifications may be added to the above-described exemplary embodiment without departing from the spirit and scope of the present disclosure. For example, in the substrate processing apparatus 10, the processing units 16 may process the wafers W with the first processing liquid and the second processing liquid different from the first processing liquid as the processing liquids, the reservoir may include the tank 102 that stores the first processing liquid and the tank 202 that stores the second processing liquid, and the control unit 18 may control the drain units 110 and 210 and the supplement units 112 and 212 to perform the liquid exchange processing for the first processing liquid in the tank 102 in parallel with the liquid exchange processing for the second processing liquid in the tank 202 when a difference between the expected time of meeting the liquid exchange conditions for the first processing liquid and the expected time of meeting the liquid exchange conditions for the second processing liquid is within a predetermined period of time.

Figure 7A:
FIG. 7A and FIG. 7B are diagrams for describing a liquid exchange processing according to another exemplary embodiment.
Figure 7B:
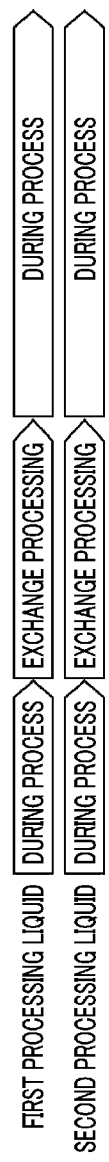

FIG. 7A and FIG. 7B are diagrams for describing the above-described liquid exchange processing according to another exemplary embodiment. If two kinds of processing liquids (first processing liquid and second processing liquid) are used, the process job cannot be performed while the liquid exchange processing of at least one of the processing liquids is performed, and, thus, an idle time occurs. For this reason, as shown in FIG. 7A, if the liquid exchange processing of the first processing liquid starts first, and then, the liquid exchange processing of the second processing liquid starts, for example, a little before the liquid exchange processing of the first processing liquid is completed, an idle time continuously occurs from when the liquid exchange processing for the first processing liquid starts until the liquid exchange processing of the second processing liquid is completed. Therefore, the downtime during which the process job cannot be performed is increased. In this regard, in the above-described liquid exchange processing according to another exemplary embodiment, as shown in FIG. 7B, the liquid exchange processing of the first processing liquid and the liquid exchange processing of the second processing liquid are performed in parallel. In this case, the control unit 18 determines whether or not the difference between the expected time of meeting the liquid exchange conditions of the first processing liquid and the expected time of meeting the liquid exchange conditions of the second processing liquid is within a predetermined period of time. If it is within the predetermined period of time, the control unit 18 controls the drain units 110 and 210 and the supplement units 112 and 212 to perform the liquid exchange processing of the first processing liquid in parallel with the liquid exchange processing of the second processing liquid. As described above, if the difference between the expected time of meeting the liquid exchange conditions of the first processing liquid and the expected time of meeting the liquid exchange conditions of the second processing liquid is within the predetermined period of time, the liquid exchange processings of the respective processing liquids are performed in parallel (a liquid exchange processing scheduled to be performed later is performed in advance of the schedule). Thus, the time (downtime) during which the process job cannot be performed can be reduced. Further, when the liquid exchange processings of the respective processing liquids are performed in parallel, the liquid exchange processings of the respective processing liquids may not be performed exactly at the same time, and the liquid exchange processing of any one of the processing liquids may start earlier (in advance) as long as the liquid exchange processings of the respective processing liquids are performed in parallel at least for some time.

Further, the control unit 18 may determine whether to perform the liquid exchange processings of the respective processing liquids in parallel (or advance the schedule of the liquid exchange processing of the processing liquid) in consideration of time of the liquid exchange processing of at least one of the first processing liquid or the second processing liquid (time required for the liquid exchange processing). Furthermore, the control unit 18 may determine a staring time of the liquid exchange processing performed in advance of the schedule in consideration of time of the liquid exchange processing of at least one of the first processing liquid or the second processing liquid.

It should be understood that these embodiments have been presented by way of example only, and are not intended to limit the scope of the present disclosure. Indeed, the embodiments described herein may be embodied in a variety of other forms. Furthermore, various omissions, substitutions and changes in the form of the embodiments described herein may be made without departing from the accompanying claims and the spirit of the present disclosure.

We claim:

1. A substrate processing apparatus, comprising:
a plurality of substrate processing units configured to process a substrate with a processing liquid;
a reservoir configured to store therein the processing liquid;
a processing liquid supply unit configured to supply the processing liquid in the reservoir to the plurality of substrate processing units;
a drain unit configured to drain the processing liquid in the reservoir;
a supplement unit configured to supplement the reservoir with the processing liquid; and
a control unit,
wherein the control unit is configured to perform a process job by controlling the processing liquid supply unit to supply the processing liquid to the plurality of substrate processing units and controlling the plurality of substrate processing units to process the substrate with the processing liquid, and
the control unit is further configured to perform, when predetermined liquid exchange conditions are met during the performing of the process job, a liquid exchange processing in parallel with the process job by controlling the drain unit to drain the processing liquid in the reservoir and controlling the supplement unit to supplement the reservoir with a new processing liquid, and
wherein the control unit is further configured to:
determine that the processing liquid satisfies a first condition according to a degradation state of the processing liquid stored in the reservoir,
determine, when the processing liquid is degraded and the first condition is satisfied, that the processing liquid satisfies a second condition according to a performance status of the process job, and
determine, when the first and the second conditions are satisfied, that the predetermined liquid exchange conditions are met for the processing liquid,
wherein the plurality of substrate processing units process the substrate with a first processing liquid and a second processing liquid different from the first processing liquid as the processing liquid,
the reservoir includes a first reservoir configured to store therein the first processing liquid and a second reservoir configured to store therein the second processing liquid,
the processing liquid supply unit supplies the first processing liquid to the plurality of substrate processing units and the second processing liquid to the plurality of substrate processing units, and
the control unit is configured to perform the liquid exchange processing of the first processing liquid in the first reservoir in parallel with the liquid exchange processing of the second processing liquid in the second reservoir when a difference between an expected time of meeting the liquid exchange conditions of the first processing liquid and an expected time of meeting the liquid exchange conditions of the second processing liquid is within a predetermined period of time.

2. The substrate processing apparatus of claim 1,
wherein the control unit determines that the processing liquid whose use in the process job has been ended satisfies the second condition.

3. The substrate processing apparatus of claim 2,
wherein the control unit performs the process job on multiple substrates as a processing unit, and
while performing a processing on a substrate in the multiple substrates, which is lastly processed with the processing liquid, during the performing of the process job, when there is a trouble that the corresponding processing is not allowed to be performed, the control unit determines that the processing liquid satisfies the second condition.

4. The substrate processing apparatus of claim 3,
wherein
the drain unit includes a first drain unit configured to drain the first processing liquid in the first reservoir and a second drain unit configured to drain the second processing liquid in the second reservoir, and
the supplement unit includes a first supplement unit configured to supplement the first reservoir with the first processing liquid and a second supplement unit configured to supplement the second reservoir with the second processing liquid.

5. The substrate processing apparatus of claim 2,
wherein
the drain unit includes a first drain unit configured to drain the first processing liquid in the first reservoir and a second drain unit configured to drain the second processing liquid in the second reservoir, and
the supplement unit includes a first supplement unit configured to supplement the first reservoir with the first processing liquid and a second supplement unit configured to supplement the second reservoir with the second processing liquid.

6. The substrate processing apparatus of claim 1,
wherein the control unit performs the process job on multiple substrates as a processing unit, and
while performing a processing on a substrate in the multiple substrates, which is lastly processed with the processing liquid, during the performing of the process job, when there is a trouble that the corresponding processing is not allowed to be performed, the control unit determines that the processing liquid satisfies the second condition.

7. The substrate processing apparatus of claim 6,
wherein
the drain unit includes a first drain unit configured to drain the first processing liquid in the first reservoir and a second drain unit configured to drain the second processing liquid in the second reservoir, and
the supplement unit includes a first supplement unit configured to supplement the first reservoir with the first processing liquid and a second supplement unit configured to supplement the second reservoir with the second processing liquid.

8. The substrate processing apparatus of claim 1,
wherein
the drain unit includes a first drain unit configured to drain the first processing liquid in the first reservoir and a second drain unit configured to drain the second processing liquid in the second reservoir, and
the supplement unit includes a first supplement unit configured to supplement the first reservoir with the first processing liquid and a second supplement unit configured to supplement the second reservoir with the second processing liquid.

9. A substrate processing method by using the substrate processing apparatus of claim 1, comprising:
- performing the process job of processing the substrate with the processing liquid; and
- performing the liquid exchange processing, in which the processing liquid stored in the reservoir configured to store therein the corresponding processing liquid is drained and the reservoir is supplemented with the new processing liquid, in parallel with the process job when predetermined liquid exchange conditions are met in the process job,
- wherein the substrate processing method further comprises:
- determining that the processing liquid satisfies the first condition according to the degradation state of the processing liquid stored in the reservoir,
- determining, when the processing liquid is degraded and the first condition is satisfied, that the processing liquid satisfies the second condition according to the performance status of the process job,
- determining, when the first and the second conditions are satisfied, that the predetermined liquid exchange conditions are met for the processing liquid, and
- performing the liquid exchange processing of the first processing liquid in the first reservoir in parallel with the liquid exchange processing of the second processing liquid in the second reservoir when a difference between an expected time of meeting the liquid exchange conditions of the first processing liquid and an expected time of meeting the liquid exchange conditions of the second processing liquid is within a predetermined period of time.

10. A computer-readable recording medium having stored thereon computer-executable instructions that, in response to execution, cause an apparatus to perform a substrate processing method as claimed in claim 9.

* * * * *